(12) United States Patent
Woelk et al.

(10) Patent No.: US 8,758,515 B2
(45) Date of Patent: Jun. 24, 2014

(54) DELIVERY DEVICE AND METHOD OF USE THEREOF

(75) Inventors: Egbert Woelk, North Andover, MA (US); Ronald L. DiCarlo, Danville, NH (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 239 days.

(21) Appl. No.: 12/853,052

(22) Filed: Aug. 9, 2010

(65) Prior Publication Data

US 2012/0034378 A1   Feb. 9, 2012

(51) Int. Cl.
*C23C 16/00* (2006.01)
*B01D 47/00* (2006.01)
*B01J 27/132* (2006.01)

(52) U.S. Cl.
USPC .. 118/726; 261/94; 261/DIG. 65; 427/255.29

(58) Field of Classification Search
USPC ............ 118/726; 261/94, DIG. 65; 220/567.3
See application file for complete search history.

(56) References Cited

U.S. PATENT DOCUMENTS

| | | | |
|---|---|---|---|
| 5,211,729 A | 5/1993 | Sherman | |
| 5,553,395 A | 9/1996 | Wen et al. | |
| 6,216,726 B1 | 4/2001 | Brown et al. | |
| 6,299,692 B1 | 10/2001 | Ku et al. | |
| 6,338,759 B1 | 1/2002 | Yu et al. | |
| 6,424,800 B1 | 7/2002 | Kim | |
| 6,444,041 B2 | 9/2002 | Vaartstra | |
| 6,607,785 B2 | 8/2003 | Timmons et al. | |
| 6,637,475 B2 | 10/2003 | Noah et al. | |
| 6,868,869 B2 | 3/2005 | Orlander | |
| 6,880,592 B2 | 4/2005 | Gregg et al. | |
| 6,921,062 B2 | 7/2005 | Gregg et al. | |
| 7,673,856 B2 | 3/2010 | Toda et al. | |
| 7,722,720 B2 | 5/2010 | Shenai-Khatkhate et al. | |
| 2003/0072875 A1 | 4/2003 | Sandhu | |
| 2004/0069224 A1 | 4/2004 | Lin et al. | |
| 2004/0170403 A1 | 9/2004 | Lei | |
| 2005/0095859 A1 | 5/2005 | Chen et al. | |
| 2006/0037540 A1* | 2/2006 | Woelk et al. .................. | 118/726 |
| 2007/0089674 A1 | 4/2007 | Aitchison et al. | |
| 2007/0266949 A1 | 11/2007 | Shenai-Khatkhate | |
| 2008/0044573 A1 | 2/2008 | Chen et al. | |
| 2008/0268143 A1* | 10/2008 | Vahlas et al. .................. | 427/185 |
| 2009/0151633 A1* | 6/2009 | Chen et al. .................... | 118/715 |

FOREIGN PATENT DOCUMENTS

| | | |
|---|---|---|
| EP | 1464735 A2 | 6/2004 |
| JP | 59118877 A | 7/1984 |
| JP | 10054356 A | 2/1998 |

OTHER PUBLICATIONS

Chinese Office Action for Application 201110261352.9 dated May 8, 2013; 6 pages.
EP Search Report for application 11176417.1 dated Feb. 28, 2013; 8 pages.
EP Search Report for Application 11176417.1 dated Feb. 28, 2013, 8 pages.

* cited by examiner

*Primary Examiner* — Parviz Hassanzadeh
*Assistant Examiner* — Nathan K Ford
(74) *Attorney, Agent, or Firm* — Cantor Colburn LLP

(57) ABSTRACT

A delivery device comprises an inlet port and an outlet port. The delivery device comprises an inlet chamber and an outlet chamber, with the outlet chamber being opposedly disposed to the inlet chamber and in fluid communication with the inlet chamber via a conical section. The outlet chamber comprises a labyrinth that is operative to prevent solid particles of a solid precursor compound contained in the delivery device from leaving the delivery device while at the same time permitting vapors of the solid precursor compound to leave the delivery device via the outlet port.

9 Claims, 7 Drawing Sheets

Enlarged depiction of Section BB'

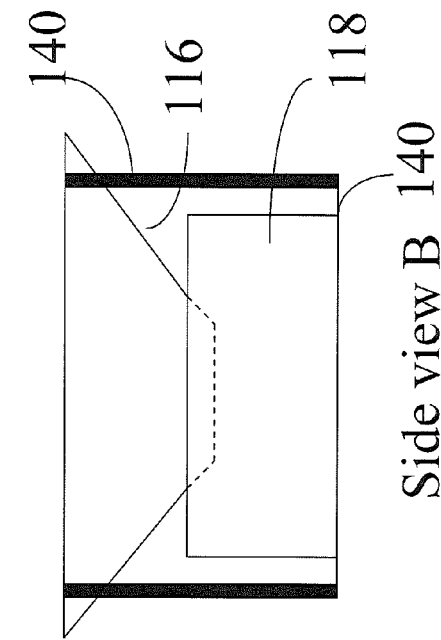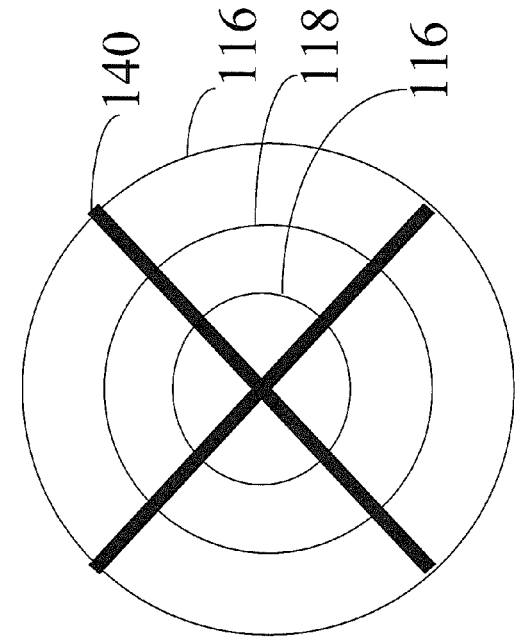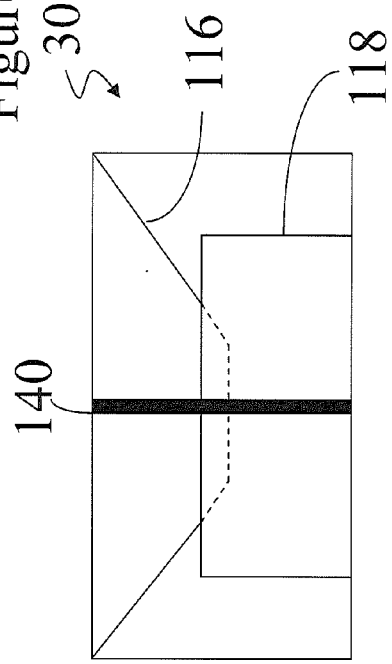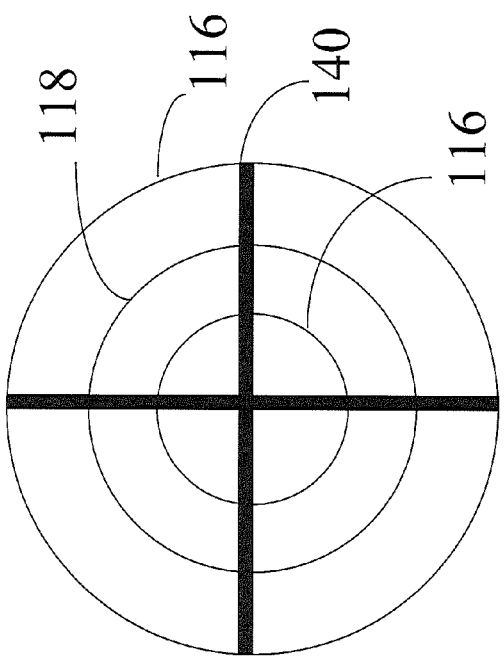
Figure 7

DELIVERY DEVICE AND METHOD OF USE THEREOF

This disclosure relates to a delivery device. In particular, this disclosure relates to a delivery device for delivering solid precursor compounds in the vapor phase to reactors.

Semiconductors comprising Group III-V compounds are used in the production of many electronic and optoelectronic devices such as lasers, light emitting diodes ("LEDS"), photodetectors, and the like. These materials are used for manufacturing different monocrystalline layers with varying compositions and with thicknesses ranging from fractions of a micrometer to a few micrometers. Chemical vapor deposition ("CVD") methods using organometallic compounds are generally employed for the deposition of metal thin-films or semiconductor thin-films, such as films of Group III-V compounds. Such organometallic compounds may be either liquid or solid.

In CVD methods, a reactive gas stream is generally delivered to a reactor to deposit the desired film on electronic and optoelectronic devices. The reactive gas stream is composed of a carrier gas, such as hydrogen and a precursor compound vapor. When the precursor compound is a liquid, a reactive gas stream is obtained by passing (i.e. bubbling) a carrier gas through the liquid precursor compound in a delivery device (i.e. a bubbler).

Solid precursors however, are placed in a cylindrical vessel or container and subjected to a carrier gas to entrain the precursor compound vapor and transport it to a deposition system. Most solid precursors exhibit poor and erratic delivery rates when used in conventional bubbler-type precursor delivery vessels. Such bubbler systems can result in a non-stable, non-uniform flow rate of the precursor vapors, especially when solid organometallic precursor compounds are used. Non-uniform organometallic vapor phase concentrations produce an adverse effect on the compositions of the films, particularly semiconductor films, being grown in metalorganic vapor phase epitaxy ("MOVPE") reactors.

Delivery devices have been developed that attempt to address the problems of delivering solid precursor compounds to a reactor. While some of these delivery devices have been found to provide a uniform flow rate, they fail to consistently provide a high concentration of precursor material to the reactor. The inability to achieve a stable supply of feed vapor from solid precursors at a consistently high concentration is problematic to the users of such equipment, particularly in semiconductor device manufacture. The unsteady precursor flow rate can be due to a variety of factors including progressive reduction in the total surface area of chemical from which evaporation takes place resulting in the formation of channels through the solid precursor compound. When a channel develops through a bed of solid precursor compound, the carrier gas will preferentially flow through such a channel rather than through the bed of precursor compound resulting in reduced contact of the carrier gas and precursor compound. Such channeling causes a decrease in the vapor phase concentration of solid precursor compound and results in unused solid precursor compound remaining in the delivery device.

Higher carrier gas flow rates give higher transportation rates of precursor compound to the vapor phase reactor. Such higher flow rates are needed to grow thicker films in less time. For example, in certain applications the growth rate is increasing from 2.5 micrometers per hour ($\mu$m/hour) to 10 $\mu$m/hour. In general, the use of higher carrier gas flow rates with solid precursor compounds is detrimental to maintaining a stable concentration of the precursor compound in the gas phase. Accordingly, there is a need for improved systems for delivering solid precursor compounds in the vapor phase to a vapor phase reactor at higher flow rates than provided by other solid precursor delivery systems.

U.S. Pat. No. 6,444,038 to Rangarajan teaches a delivery device for delivering solid precursor compounds in the vapor phase to reactors. The delivery device has a gas inlet for introducing a carrier gas into the delivery device. The carrier gas flows through a solid precursor compound to substantially saturate the carrier gas with the precursor compound. The carrier gas entrained with vapors of the precursor compound exits the cylinder to the reactor via a porous element. This delivery device can deliver solid precursor compounds in the vapor phase to a vapor phase reactor at higher flow rates than provided by other solid precursor delivery systems. However, it suffers from the drawback that the porous element sometimes undergoes clogging thereby reducing the rate of delivery of the solid precursor compound to the reactor.

It is therefore desirable to have a delivery device that can deliver a uniform and high concentration of precursor vapor throughout the process up to depletion of the solid precursor compound from the delivery device. There remains a need for improved delivery devices and methods for delivering a vapor of solid precursor compound where the solid precursor compound is depleted from the delivery device and where the vapor concentration of the solid precursor compound remains uniform and at a sufficiently high concentration.

Disclosed herein is a delivery device comprising an inlet port; an outlet port; an inlet chamber; and an outlet chamber; the outlet chamber being opposedly disposed to the inlet chamber and in fluid communication with the inlet chamber via a conical section; the outlet chamber comprising a labyrinth that is operative to prevent particles of a solid precursor compound contained in the delivery device from leaving the delivery device while at the same time permitting vapors of the solid precursor compound to leave the delivery device via the outlet port.

Disclosed herein is a method of depositing a film comprising providing a delivery device; wherein the delivery device has an inlet port and an outlet port with a labyrinth disposed therebetween; the labyrinth being formed by a restrictor, a conical section and an inner wall of the delivery device; where a portion of the conical section protrudes through a plane that includes a circumferential surface of the restrictor; introducing a carrier gas into the delivery device through the inlet port; flowing the carrier gas through a solid precursor compound to substantially saturate the carrier gas with the precursor compound; the carrier gas saturated with the precursor compound exiting from the delivery device through the outlet port, where the labyrinth causes the carrier gas to make at least two turns, each turn being greater than or equal to an average angle of about 120 degrees when measured with respect to the average direction of the carrier gas prior to making the turn; delivering the carrier gas with the precursor compound to a reaction vessel containing a substrate; and subjecting the precursor compound to conditions sufficient to decompose the precursor compound to form a film on the substrate.

FIG. 7 depicts a modular version of the conical section that can be disposed in the delivery device and easily removed for repairs and maintenance.

The invention now will be described more fully hereinafter with reference to the accompanying drawings, in which various embodiments are shown. Like reference numerals refer to like elements throughout.

Figure 1:
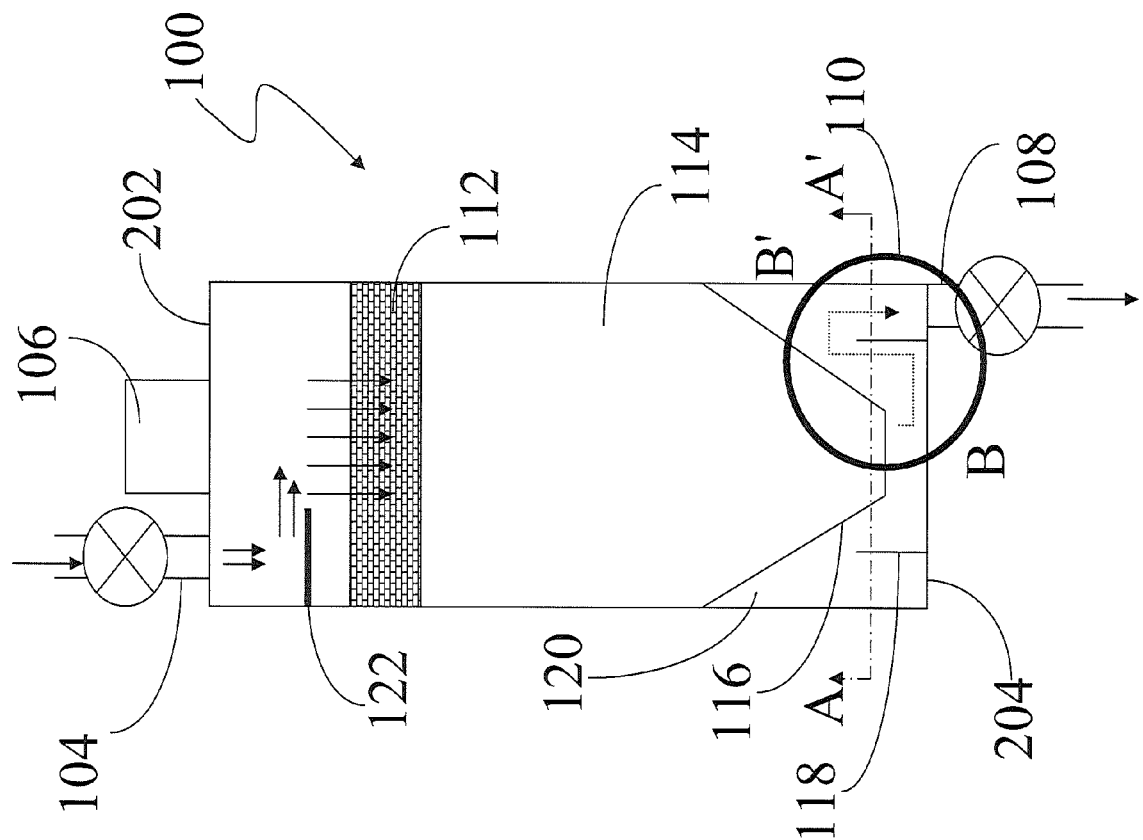
FIG. 1 depicts an exemplary delivery device that contains a labyrinth. In this embodiment, a carrier gas flows from top to bottom.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The transition term "comprising" encompasses the transition terms "consisting of" and "consisting essentially of".

Various numerical ranges are disclosed herein. These ranges are inclusive of the endpoints as well as numerical values between these endpoints. The numbers in these ranges are interchangeable.

Disclosed herein is a delivery device for storing a solid precursor compound. The delivery device comprises a labyrinth that causes any fluid travelling therethrough to make at least two changes in direction in order to exit the delivery device. Each change in direction involves an average angular change of greater than or equal to about 120 degrees relative to the average direction of travel of the carrier gas (and any entrained vapors) prior to making the change in direction. These changes in direction facilitate the entrapping of solids (e.g., particles of the solid precursor compound) while simultaneously permitting fluids (e.g., vapors of solid precursor compounds and carrier gases) to exit the delivery device. The presence of the labyrinth permits a uniform delivery of the vapors of the solid precursor compound at relatively high concentrations over extended periods of time.

FIG. 1 depicts a delivery device 100 for storing a solid precursor compound, an inlet port 104 for introducing the carrier gas into the delivery device 100, a fill port 106 for filling and refilling the delivery device 100, and an outlet port 108 through which the carrier gas entrained with vapors of the solid precursor compound are discharged to a reactor (not shown) from the delivery device 100. Disposed between the inlet port 104 and the outlet port 108 is a labyrinth 110. The labyrinth 110 causes any fluid travelling therethrough to make at least two changes in direction through an angle of 120 degrees or greater. This change in direction facilitates the entrapping of solid particles of the solid precursor compound while simultaneously permitting vapors and carrier gases to exit the delivery device via the outlet port 108. The labyrinth 110 advantageously does not undergo clogging and therefore permits a uniform delivery of the vapors of the solid precursor compound at a relatively high concentration over an extended period of time.

The delivery device 100 comprises an inlet chamber 114 and an outlet chamber 120. The solid precursor compound is stored in the inlet chamber 114 but not in the outlet chamber 120. A carrier gas travels through the inlet chamber 114 and the outlet chamber 120 and entrains vapors of the solid precursor compound prior to being discharged from the delivery device 100. The delivery device 100 comprises a first end 202 and a second end 204. In one embodiment, the carrier gas can travel from the top to the bottom of the delivery device prior to being discharged from the delivery device to a reactor. In another embodiment, the carrier gas can travel from the bottom to the top of the delivery device prior to being discharged to the reactor.

The first end 202 is generally located higher from the floor of the building in which the delivery device is housed, while the second end 204 is located closer to the floor of the building than the first end 202. When the carrier gas flows from top to bottom in the delivery device 100, the inlet port 104 is fixedly attached to the first end 202 while the outlet port 108 is fixedly attached to the second end 204. On the other hand (which will be discussed in detail in the FIG. 6), when the carrier gas flows from bottom to top in the delivery device 100, the outlet port 108 is fixedly attached to the first end 202 while the inlet port 104 is fixedly attached to the second end 204. The fill port 106 is fixedly attached to the first end 202 of the delivery device 100. The delivery device 100 preferably includes a packing material 112 disposed between the first end 202 and the second end 204.

In one embodiment, the delivery device 100 is an elongated cylindrical shaped portion having an inner surface defining a substantially constant cross-section throughout the length of the cylindrical portion. As can be seen in the FIG. 1, the delivery device 100 further includes an optional conical-shaped lower portion 116 (hereinafter the "cone section 116"). The cone section 116 decreases in cross-section from the first end 202 towards the second end 204 of the delivery device and partially separates the inlet chamber 114 from the outlet chamber 120. The inlet chamber 114 is in fluid communication with the outlet chamber 120 via the cone section 116. In other words, the cone section 116 contains an opening at its lower end between the inlet chamber 114 and the outlet chamber 120. The solid precursor compound is contained in the inlet chamber 114 and the outlet chamber 120.

Delivery device 100 can be of any suitable size. The particular size of delivery device 100 will depend on the equipment (i.e., the reactor) in which the device is used as well as the amount of solid precursor compound to be contained with delivery device 100. In one embodiment, the delivery device 100 has a height to diameter ratio of greater than or equal to 3, and more specifically greater than or equal to 5. In one embodiment, the delivery device 100 is cylindrical with a diameter of 8 to 20 centimeters and specifically 10 to 13 centimeters. For example, when trimethylindium is the solid precursor compound, the delivery device 100 generally carries a load of 0.25 to 20 kilograms and specifically a load of 0.50 to 10 kilograms of the trimethylindium. When other solid precursor compounds are used, the specific weight carried by the delivery device 100 will vary depending upon the size of the delivery device 100 used and the density of the solid precursor compound employed. While the delivery device 100 has a circular cross-sectional area in a direction perpendicular to a vertical, the cross-sectional area may be of any suitable shape, such as oval, square, rectangular, triangular, or the like.

In another embodiment, the inlet chamber 114 and outlet chamber 120 are concentric. When the inlet and outlet chambers are concentric, the inlet chamber may be contained within the outlet chamber or the outlet chamber may be contained within the inlet chamber if desired.

The inlet port 104 is in fluid communication with the inlet chamber 114. The inlet chamber further comprises an optional deflector 122 disposed just below the inlet port 104. The deflector 122 deflects a portion of the incoming carrier gases and facilitates distribution of the carrier gases across the entire surface of the solid precursor compound. The deflector 122 also prevents the carrier gas from impinging on only one portion of the solid precursor compound and unevenly removing this portion of the solid relative to the remainder of the solid precursor compound. The inlet chamber 114 further contains a preferred packing material 112 disposed in the inlet chamber. Disposed between the packing material 112 and the floor of the outlet chamber 120 is the solid precursor compound. When the carrier gas flows from the top to bottom the use of the packing material 112 is effective in preventing a non-uniformity in the solid precursor to form a channel or void. When the carrier gas flows from bottom to top, the packing material is optional.

The outlet chamber 120 is disposed on the opposing side of the cone section 116 from the inlet chamber 114 and comprises one or more restrictors 118 that together with the lower portion of the cone section 116 forms a tortuous path that constitutes the labyrinth 110. In one embodiment, the labyrinth is formed by the cone section 116, the restrictors 118 and an inner wall of the delivery device 100. In another embodiment, the labyrinth is formed by the lower portion of the cone section 116, the restrictor 118 and the inner wall of the delivery device 100.

Figure 2:
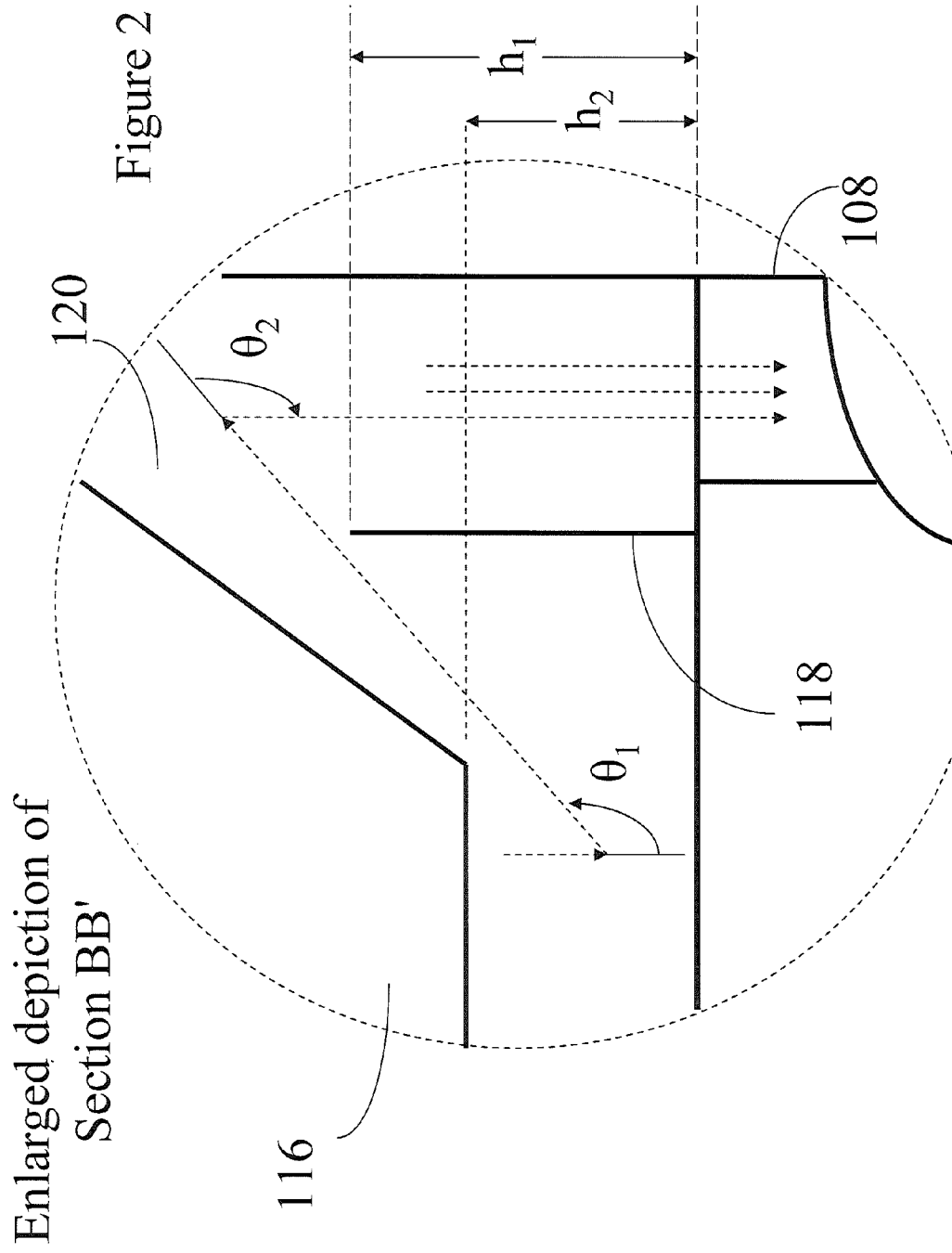
FIG. 2 is an enlarged view of section BB' that depicts the labyrinth from FIG. 1.
Figure 3:
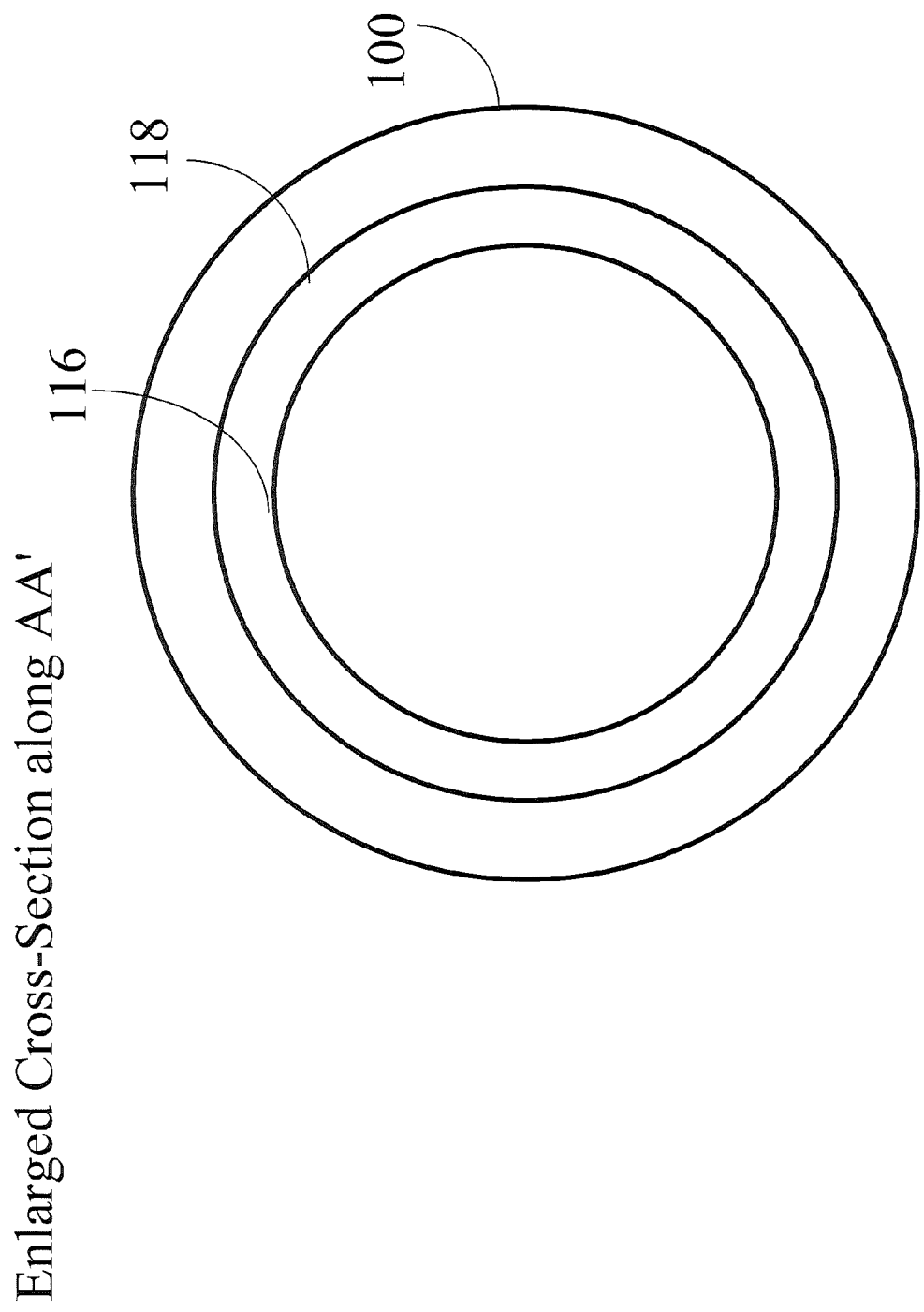
FIG. 3 is an enlarged view of section AA' from the FIG. 1.

The FIGS. 2 and 3 show portions of the outlet chamber 120 as included in the encircled section BB' and the cross-section AA' from the FIG. 1 respectively. The restrictor 118 is a wall that is disposed on the floor of the outlet chamber and surrounds the lower end of the conical shaped lower portion 116 as can be seen in the FIGS. 2 and 3. In one embodiment, the restrictor 118 is a ring that surround the cone section 116. In other words, the cone section 116 protrudes through a plane that encompasses a circumferential surface of the restrictor 118. The restrictor 118 need not completely surround the cone section 116 and may only surround those portions of the cone section 116 that have a direct line of sight to the outlet port 108.

The restrictor 118 has a height "$h_1$" from the floor of the inner surface of the outlet chamber 120. The height $h_1$ is generally measured from the floor (or alternatively from the roof in the FIG. 6) of the outlet chamber to the cone at its smallest diameter. The lower end of the cone section 116 is located at a height "$h_2$" from the floor of the inner surface of the outlet chamber 120, such that $h_1$ is always greater than $h_2$. Since $h_1$ is greater than $h_2$, a fluid exiting the cone section 116 will have to travel a zig-zag path to exit the delivery device 100. In short, the zig-zag path is created by the conical section 116 protruding through a plane that includes the upper surface of the restrictor 118. The path of travel of the carrier gas and entrained vapors of the solid precursor compound is shown by the dotted line in the FIGS. 1 and 2.

From FIG. 2 it may be seen that the carrier gas (and entrained vapors) that exits the cone section 116 has to make an average first turn through an angle $\theta_1$ that is greater than about 120 degrees, specifically greater than or equal to about 140 degrees, and more specifically greater than or equal to about 160 degrees in order to get over the restrictor. This angle of the first turn is measured from the average original direction of travel as the carrier gas exits the cone section 116. In order to exit the outlet chamber 120, the carrier gas (an entrained vapors) will have to make a second turn through an angle $\theta_2$ after the first turn that is greater than about 120 degrees, specifically greater than or equal to about 140 degrees, and more specifically greater than or equal to about 160 degrees when measured from the average original direction of travel after the carrier gas completes its first turn. These changes in direction that the carrier gas along with any entrained vapors have to make in order to exit the delivery device 100 entrap any solids, while at the same time permitting fluids to escape.

Figure 4:
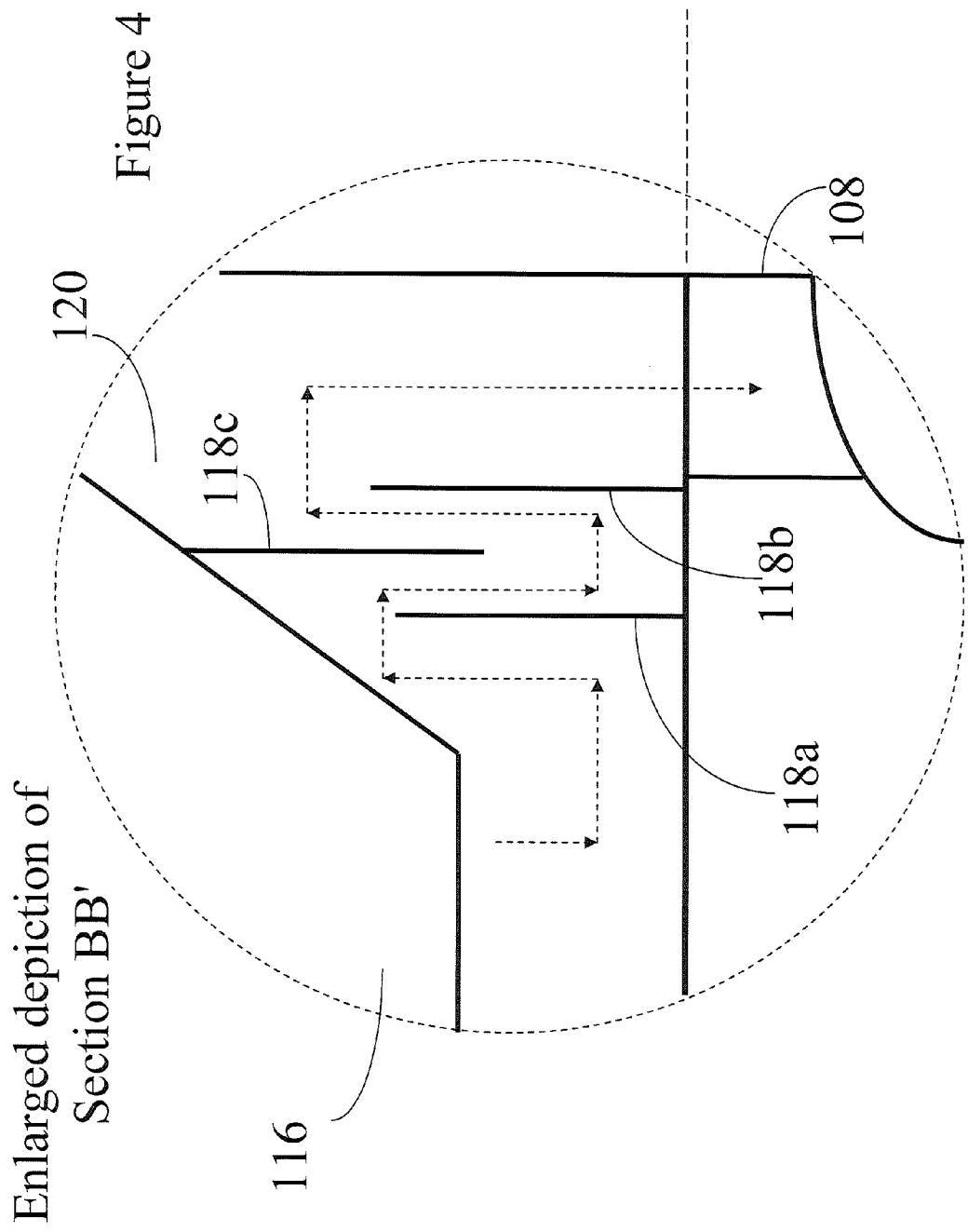
FIG. 4 depicts an alternative embodiment of the labyrinth depicted in section BB' of the FIG. 1.

In one embodiment, the labyrinth 110 can be arranged to include more restrictors (or other obstacles) so that the carrier gas with entrained vapors that exits the delivery device 100 will have to travel a more tortuous path to escape the delivery device 100. The FIG. 4 depicts one such labyrinth that could be used to replace the labyrinth seen in the FIG. 2 if desired. The FIG. 4 depicts two restrictors 118a and 118b disposed on the floor of the outlet chamber 120 with a third restrictor 118c disposed on an outer surface of the cone section 116 such that the third restrictor 118c protrudes into the space between the restrictor 118a and the restrictor 118b. In this embodiment, the lower portion of the conical section 116 protrudes through a plane that includes the upper surface of the restrictor 118a. The other restrictor 118b may be higher than the restrictor 118a when measured from the floor of the outlet chamber 120.

This arrangement causes a fluid that emanates from the cone section 116 to have to make at least 4 or more changes in direction, specifically 5 or more changes in direction, and more specifically 6 or more changes in direction in order to exit the delivery device 100. The path of travel of the carrier gas and entrained vapors of the solid precursor compound is shown by the dotted line in FIG. 4.

Figure 5:
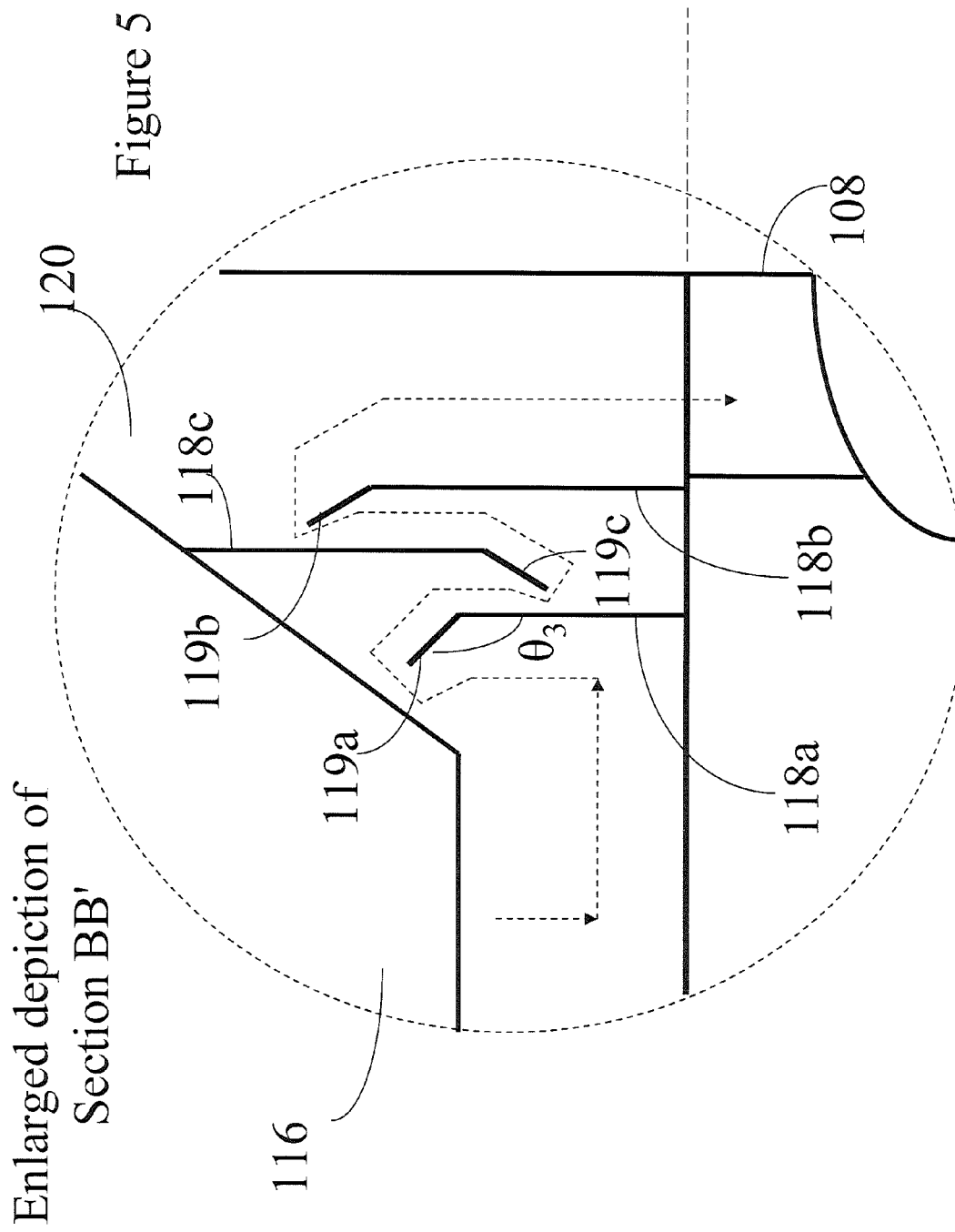
FIG. 5 depicts yet another alternative embodiment of the labyrinth depicted in section BB' of the FIG. 1. In this embodiment, each restrictor is affixed with a baffle that protrudes into the stream of oncoming carrier gas.

In one embodiment depicted in the FIG. 5, each restrictor is provided with a baffle that protrudes into the path of travel of the carrier gas thus increasing the length of the path to the outlet port 108. For example, the restrictor 118a has a baffle 119a disposed thereon, the restrictor 118b has a baffle 119b disposed thereon while the restrictor 118c has a baffle 119c disposed thereon. The baffle 119a is inclined at an angle $\theta_3$ to the axis of the restrictor 118a and protrudes into the path of the carrier gas. The baffle protrudes into the path of oncoming carrier gases. Centrifugal forces caused by the flow of carrier gases in the labyrinth will cause the heavier solid precursor particles to travel towards the outside of the flow field and contact the baffle, thereby slowing them down and preventing them from exiting the outlet chamber 120. The path of travel of the carrier gas and entrained vapors of the solid precursor compound is once again shown by the dotted line. In comparing FIGS. 4 and 5, it may be seen that the path of the carrier gases is increased by the presence of the baffles.

In the FIGS. 1-5, the carrier gas travels from top to bottom of the delivery device 100 in order to entrain vapors of the solid precursor compound and discharge them to the reactor. In the design shown in the FIGS. 4 and 5 however, the delivery device 100 can be operated upside down as well. This is depicted in the FIG. 6.

An advantageous method of transporting vapors of the solid precursor compound to the reactor is to allow the carrier gas to travel through the delivery device from bottom to top. When the carrier gas travels from bottom to top, it causes the solid precursor compound to be in constant motion as it is subjected to competing forces between the incoming carrier gas and those due to gravity. This method reduces the probability of channeling through the solid precursor compound because of constant agitation that the precursor is subjected to. It also allows for a continuous and constant supply of uniform delivery of the vapors of the solid precursor compound at relatively high concentrations over extended periods of time.

Figure 6:
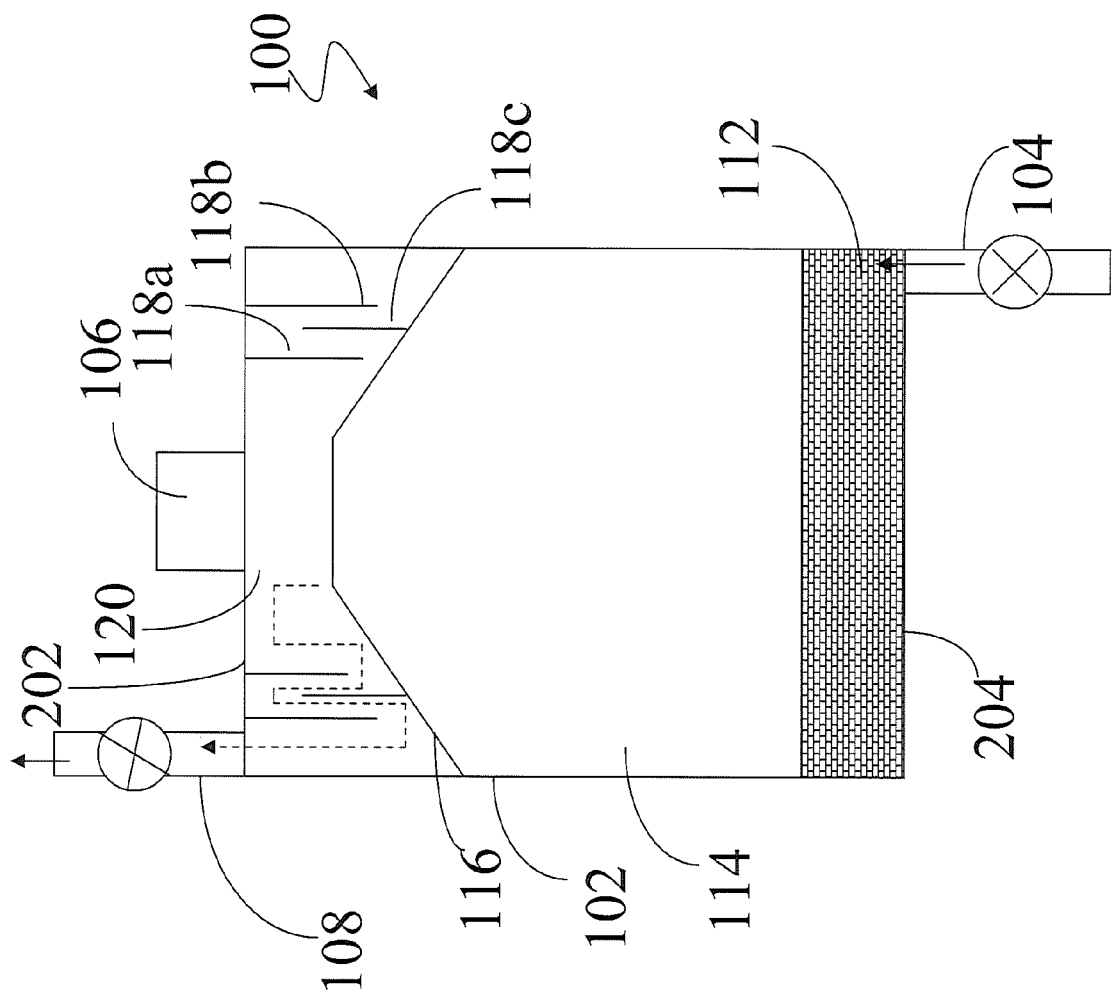
FIG. 6 depicts another embodiment of an exemplary delivery device that contains the labyrinth. In this embodiment, a carrier gas flows from bottom to top.

The FIG. 6 depicts one manner of exporting vapors of the solid precursor compound while having the carrier gas travel from bottom to top of the deliver device 100. In the FIG. 6, the inlet port 104 is disposed on the second end 204 of the delivery device 100, while the outlet port 108 is disposed on the first end 202 of the delivery device. The delivery device comprises an inlet chamber 114 and an outlet chamber 120. Both the inlet chamber and the outlet chamber contain the solid precursor compound. A fill port 106 is disposed on the first end 202 from which the inlet chamber and the outlet chamber can be filled and refilled.

The outlet chamber 120 comprises a plurality of restrictors 118a, 118b and 118c, which are concentrically arranged to permit the carrier gases with the entrained vapors of the solid precursor compound to travel in a zig-zag fashion in order to exit the delivery device 100. The restrictors are alternatively disposed on the roof of the outlet chamber 120 and the cone section 116 as seen in the FIG. 6. For example, a first restrictor 118a and a third restrictor 118b are disposed on the roof of the outlet chamber 120, while the second restrictor 118c is disposed on the surface of the cone section 116. The second restrictor lies between the first and the third restrictors and protrudes into the space between the first and third restrictors. This protrusion forces the carrier gases with the entrained vapors of the solid precursor compound to change directions at least twice, where each change in direction involves travelling through an angle of greater than or equal to about 120 degrees from the average direction of travel prior to changing direction. These changes in direction cause the solid particles to become entrapped in the labyrinth, while the carrier gas (with entrained vapors) exit the outlet chamber 120 free from an solid particles of the solid precursor compound. In this embodiment, the upper end of the conical section 116 protrudes through a plane that includes the lower surface of the restrictor 118a.

The delivery device 100 and the inlet and outlet ports 104, 108, may be manufactured from a material that is not deteriorated by the carrier gas or the solid precursor compound and that in turn does not change the composition of the carrier gas or the solid precursor compound. It is also desirable for the material to withstand the temperatures and pressures of operation. The delivery device may be manufactured from a suitable material, such as, for example, glass, polytetrafluoroethylene and/or a metal. In one embodiment, the delivery device is constructed of a metal. Exemplary metals include nickel alloys and stainless steels. Suitable stainless steels include SS304, SS304L, SS316, SS 316 L, SS321, SS347 and SS430. Exemplary nickel alloys include without limitation INCONEL, MONEL, and HASTELLOY.

A wide variety of packing materials 112 may be used in the delivery device 100 provided that they are inert to the solid precursor compound and the cylinder under conditions of use. In general, it is desirable that the packing material is flowable. For example, as the solid precursor compound is depleted from the cylinder, the level of the solid precursor compound in the cylinder will decrease and the packing material needs to flow such that it fills in any depressions in the surface of the precursor compound layer. Suitable packing materials include ceramics, glasses, clays, organic polymers, and combinations comprising at least one of the foregoing. Examples of suitable ceramic packing materials include alumina, silica, silicon carbide, silicon nitride, borosilicates, alumina silicates, and combinations comprising at least one of the foregoing.

In one embodiment, the packing material is not an elemental metal such as nickel or a metal alloy such as stainless steel. Packing materials do include precursor compounds and other materials containing metals in combination with non-metal elements. In another embodiment, an organometallic compound used as the packing material may be the same as the precursor compound. For example, a solid precursor compound that is a powder may be compressed to form pellets.

The pelletized precursor compound may be used as the packing material on a layer of the same precursor compound (that is not in pelletized form).

In another embodiment, packing materials offering additional advantages such as stabilizing agents may be used provided that they are inert to the solid precursor compound and the cylinder under the conditions of use. Exemplary stabilizing agents include without limitation oxygen scavengers (getters), thermal stabilizers, antioxidants, anti-static agents, free-radical scavengers, and tagging (marking) agents. Suitable getter materials include compounds and formulations containing compounds of oxygen reactive metals such as sodium, potassium, lithium, aluminum, indium, gallium, manganese, cobalt, copper, barium, calcium, lanthanum, thorium, magnesium, chromium and zirconium.

In one embodiment, the stabilizing agent is a member of the class of ionic salts that are non-polar and non-volatile such as tetraorganylammonium compounds mixed with organoaluminums; salts of aluminum, indium and gallium; organolithiums; metallocenes of magnesium, zirconium, and lanthanum; metal beta-diketonates including dipivaloylmethanato ("dpm") compounds of aluminum, indium, gallium, barium, strontium and copper and hexafluoroacetylacetonato ("hfac") compounds of aluminum, indium, gallium, barium, strontium and copper. The packing material may contain a stabilizing agent or may itself be a stabilizing agent.

The packing material may be any of a wide variety of shapes, such as beads, rods, tubes, horseshoes, rings, saddles, discs, saucers, or any other suitable form such as aciform, cruciform, and helicoids (coils and spirals). Combinations of different shapes may be used if desired. Packing materials are generally commercially available from a variety of sources. Although the packing material may be used as is, it may be cleaned prior to use.

Packing material having a variety of sizes (e.g. diameters), such as 0.05 millimeters ("mm") or greater, such as up to 5 mm or even greater may be used. A suitable range of sizes for the packing material is from 0.1 to 5 mm. The packing material may be of a uniform size or may be a mixture of sizes. In one embodiment, the size of the packing material is selected such that it is substantially the same as the particle size of the solid precursor compound, i.e., the mean size of the packing material is within 25% of the mean particle size of the precursor compound. In one embodiment, the mean size of the packing material is within 20% of the particle size of the precursor compound, more specifically within 15% and even more specifically within 10%.

The packing material is placed in the delivery device in such a manner so that the carrier gas first passes through the packing material before the solid precursor compound. When the flow of the carrier gas in the delivery device 100 is from top to bottom (as depicted in the FIG. 1), the precursor composition is generally prepared by introducing a layer of the solid precursor compound to the delivery device followed by depositing a layer of the packing material on the surface of the solid precursor compound layer.

On the other hand, when the flow of the carrier gas in the delivery device 100 is from bottom to top (as depicted in the FIG. 6), the precursor composition is generally prepared by introducing layer of the packing material into the delivery device followed by introducing a layer of the solid precursor compound into the device.

The solid precursor material may be added to the delivery device by any suitable means. Likewise, the packing material may be layered on the solid precursor compound by any suitable means. When the solid precursor compound is fritted (this will be discussed below), the packing material may be added prior to, during, or after the fritting step. In an alternate embodiment, the precursor composition is prepared by introducing both the solid precursor compound and the packing material to a delivery device followed by subjecting the delivery device to conditions, which causes the packing material to lie upstream to the solid precursor compound with respect to the flow direction of the carrier gas.

The volume ratio of solid precursor compound to packing material may vary over a wide range, such as from 10:1 to 1:10. In one embodiment, the volume ratio is in the range of 1:4 to 4:1.

Any suitable carrier gas may be used with the delivery device 100 as long as it does not react with the solid precursor compound. The particular choice of carrier gas depends upon a variety of factors such, among others, the precursor compound used and the particular chemical vapor deposition system employed. Suitable carrier gases include hydrogen, nitrogen, argon, helium, and the like. The carrier gas may be used with the present cylinders at a wide variety of flow rates. Such flow rates are a function of the cylinder cross-sectional dimension and pressure. Larger cross-sectional dimensions allow higher carrier gas flows, i.e., linear velocity, at a given pressure. For example, when the cylinder has a 5 centimeter ("cm") cross-sectional dimension, carrier gas flow rates of up to 500 standard cubic centimeters ("sccm") and greater may be used. The carrier gas flow entering the cylinder, exiting the cylinder, or both entering and exiting the cylinder may be regulated by a control means. Any conventional control means may be used, such as manually activated control valves or computer activated control valves.

As detailed above, the solid precursor compound may be contained within the inlet chamber and the outlet chamber of the delivery device. Such a solid precursor compound is the source of precursor compound vapor. Any solid precursor compound suitable for use in vapor delivery systems may be used in the delivery device. Suitable precursor compounds include indium compounds, zinc compounds, magnesium compounds, aluminum compounds, gallium compounds, and combinations comprising at least one of the foregoing compounds.

Exemplary precursor compounds include trialkyl indium compounds such as trimethyl indium ("TMI") and tritertiarybutyl indium; trialkyl indium-amine adducts; dialkyl haloindium compounds such as dimethyl chloroindium; alkyl dihaloindium compounds such as methyl dichloroindium; cyclopentadienyl indium; trialkyl indium; trialkyl arsine adducts such as trimethyl indium-trimethyl arsine adduct; trialkyl indium-trialkyl-phosphine adducts such as trimethyl indium-trimethyl phosphine adduct; alkyl zinc halides such as ethyl zinc iodide; cyclopentadienyl zinc; ethylcyclopentadienyl zinc; alane-amine adducts; alkyl dihaloaluminum compounds such as methyl dichloroaluminum; alkyl dihalogallium compounds such as methyl dichlorogallium; dialkyl halogallium compounds such as dimethyl chlorogallium and dimethyl bromogallium; biscyclopentadienyl magnesium ("$Cp_2Mg$"); carbon tetrabromide; metal beta-diketonates, such as beta-diketonates of hafnium, zirconium, tantalum and titanium; metal dialkylamido compounds such as tetrakis(dimethylamino)hafnium; silicon compounds and germanium compounds such as bis(bis(trimethylsilyl)amino) germanium. In the above precursor compounds, the term "alkyl" refers to ($C_1$-$C_6$)alkyl. Mixtures of precursor compounds may be used in the present delivery devices.

Optionally, the solid precursor compound may be fritted. As used herein, "fritting" refers to the fusing of the solid precursor compound. It has been found that a frit of solid precursor compound in a delivery device enables a more consistent, stable concentration of precursor compound in the vapor phase and provides better depletion of the solid precursor compound from the cylinder as compared with other conventional techniques or other commercially available devices. A "frit of solid precursor compound" refers to a fused cake of solid precursor compound having a substantially level top surface and sufficient porosity to allow the carrier gas to pass through the cake. In general, when the frit of solid precursor compound is first formed, it conforms to the internal dimensions of the cylinder, that is, the frit has a width substantially equal to the interior dimension of the inlet chamber. The height of the frit will depend upon the amount of solid precursor compound used.

Fritting is accomplished by subjecting the solid precursor compound to conditions that provide a frit of the solid precursor compound having a substantially level surface. In general, the solid precursor compound is first added to the cylinder (e.g., to the inlet chamber), the cylinder is agitated to provide the solid precursor compound with a substantially level surface, the solid precursor compound is then fritted to form a frit of the solid precursor compound. Such a fritting step may optionally be performed with heating and is preferably performed with heating. In another embodiment, the agitation step may be performed with heating. Agitation may be performed by any suitable means, such as tapping, vibrating, rotating, oscillating, rocking, stirring, pressurizing, vibrating by electrostrictive or magnetostrictive transducers, or shaking the cylinder to provide a level top surface of the precursor compound. Combinations of such agitation methods may be used.

The heating step is performed at a temperature below the decomposition temperature of the solid precursor compound. In one embodiment, the heating step is performed at a temperature of up to 5° C. below the decomposition temperature of the solid precursor compound, and more specifically up to 10° C. below the decomposition temperature of the solid precursor compound. For example, trimethylindium may be fritted at a temperature of about 35 to about 50° C. Such controlled heating may be performed using a water bath, an oil bath, hot air, a heating mantle, and the like. The fritting step is performed for a period of time sufficient to fuse the solid precursor compound into a frit. The time used for the fritting step depends on the particular solid precursor compound used, the amount of the solid precursor compound, and the particular temperature used, among other factors. Alternatively, the fritting step may be performed under reduced pressure.

The particular porosity of the precursor compound frit depends upon the fritting temperature used, the particular precursor compound used and the starting particle size of the precursor compound, amongst other factors. Smaller particles of solid precursor compound generally provide a frit having smaller pores as compared to a frit formed from larger particles of the same solid precursor compound. As used herein, "pore" refers to the space between particles of fused solid precursor compound.

A desired particle size of the solid precursor compound may be obtained by a variety of methods, such as crystallization, grinding, and sieving. The solid precursor compound may be dissolved in a solvent and crystallized by cooling, by the addition of a non-solvent or by both to provide the desired particles. Grinding may be performed manually, such as with a mortar and pestle, or by machine such as by using a grinding mill. Particles of the solid precursor compound may be sieved to provide a solid precursor compound having a substantially uniform particle size. Combinations of such methods may be employed to obtain a precursor compound in the desired particle size. In an alternative embodiment, solid precursor compound having particles having different particle sizes may be used. The use of such different particle sizes may provide a frit of the solid precursor compound having varying pore sizes.

In a further embodiment, the frit of the solid precursor compound may contain a porosity gradient, i.e., a gradient of pore sizes. Such pore size gradient may be obtained by fritting a gradient of particles of the solid precursor compound having varying sizes. Such gradient can be formed by sequentially adding particles of increasing (or decreasing) size to the cylinder; and agitating the cylinder to provide the solid precursor compound with a level surface; and fritting the solid precursor compound.

In yet another embodiment, the frit of the solid precursor compound may contain regions of different pore sizes. For example, the frit may contain a region having a relatively large pore size, e.g., 5 µm (micrometers), and a region having a relatively small pore size, e.g. 2 µm. There may be one or more of each region. When there are more than one of each such regions, the respective regions may be alternated with one another. Additionally, there may be one or more other regions having yet different pore sizes.

Pore sizes in the frit of solid precursor compound may also be controlled by using one or more of certain porosity forming aids, such as organic solvents or other removable agents. Any organic solvent that does not react with the precursor compound may be used. Suitable organic solvents include aliphatic hydrocarbons, aromatic hydrocarbons, amines, esters, amides, and alcohols. Such organic solvents do not need to, but may, dissolve the solid precursor compound. In one embodiment, a slurry of the precursor compound and solvent is added to a cylinder. A substantially level surface of the slurry is formed. The solvent is then removed and the solid precursor compound is fritted. It will be appreciated by those skilled in the art that the solvent may be removed before, during or after the fritting step.

In one embodiment, in one method of manufacturing the delivery device 100, a cylindrical enclosure that forms the delivery device is first machined to the desired dimensions. The delivery device 100 is preferably cylindrical (i.e., its cross-sectional area is circular), but may have other cross-sectional geometries if desired.

A cone section 116 is then disposed in the delivery device 100. The cone section 116 may be welded or screwed into the delivery device 100. Alternatively, the cone section 116 may comprise a prefabricated section (e.g., a modular insert) that is placed in the delivery device 100 prior to disposing the first end 202 or the second end 204 onto the ends of the delivery device. An exemplary prefabricated cone section 300 is depicted in the FIG. 7.

The prefabricated cone section 300 comprises a frame 140 upon which is disposed the restrictor 118 and the cone section 116. The frame 140 comprises 3 or more pillars that are U-shaped. The opposing ends of the pillars are attached to the cone section 116, while the restrictor 118 is fixedly attached to the horizontal portions of the pillars. In one embodiment (not shown), the prefabricated cone section 300 may comprise a base plate instead of U-shaped pillars. The base plate has a hole to accommodate the outlet port. One end of the pillars is attached to the base plate while the other end is attached to the cone section 116. The restrictor 118 is fixedly attached to the base plate. The prefabricated cone section 300 is advantageous in that it avoids cumbersome manufacturing process such as welding the cone section 116 on the inside of the cylinder. The prefabricated cone section 300 can just be dropped into the cylindrical delivery device 100 after the first or the second end 204 is attached to the delivery device 100.

The first end 202 and/or the second end 204 are then disposed on the cylindrical delivery device at the ends as the case may be. If the prefabricated cone section 300 is not used, then the restrictor 118 may be disposed onto the first or the second end as desired, prior to disposing the first end 202 and/or the second end 204 onto the delivery device 100. The cone section 116 may also be disposed in the delivery device prior to disposing the first end 202 and/or the second end 204 onto the delivery device 100.

The first end 202 and the second end 204 may be either fixedly or removably attached to the cylindrical delivery device 100 at the ends. In one embodiment, the first end 202 and the second end 204 may be welded to the cylindrical delivery device 100 at the ends. In another embodiment, the first end 202 and the second end 204 may be screwed or bolted onto the ends of the cylindrical delivery device. The fill port 106 is disposed on either the first end 202 or the second end 204 or on both the first and the second end depending upon the mode in which the delivery device is used.

If the carrier gas will be made to flow from top to bottom then it is desirable to dispose the fill port at the first end 202, while if the carrier gas will be made to flow from bottom to top then it is desirable to dispose the fill port at the second end 204. In an alternative embodiment, the fill port 106 may be located at the second end 204 when the carrier gas travels from top to bottom, while the fill port 106 may be located at the first end 202 when the carrier gas travels from bottom to top. Fill ports 106 may also be disposed on the first end 202 and the second end 204 of the delivery device 100 for ease of filling or refilling the delivery device 100 if desired.

The inlet port 104 and the outlet port 108 are then disposed on the respective ends of the delivery device depending upon the direction of flow of the carrier gas. When the carrier gas flows from top to bottom, the inlet port 104 is disposed on the first end 202, while if the carrier gas flows from bottom to top, the inlet port 104 is disposed on the second end 204 of the delivery device 100. Each port has a valve for controlling the flow of the carrier gases.

In one manner of operating the delivery device 100, a solid precursor compound may be disposed into the delivery device. If the solid precursor compound is in powder form, it may be poured into the inlet chamber 114 through the fill port 106. The powder enters the inlet chamber 114 and flows into the outlet chamber 120 through the opening in the cone section 116. The cone section 116 acts as a guide to cause the powder to collect inside the restrictor 118. Since the height "$h_1$" of the restrictor 118 is greater than the depth h of the cone section (see FIG. 1) from the floor of the outlet chamber, the powder does not flow over the restrictor 118. If the solid precursor compound is not a powder but is a solid, then a solid block of the precursor compound may be disposed directly into the inlet chamber 114.

After the requisite amount of solid precursor compound is disposed in the delivery device 100, the packing material 112 is disposed onto the solid precursor compound. The fill port 106 is then closed.

The delivery device is equilibrated to the desired temperature and the flow of carrier gas is then started. The carrier gas enters through the inlet port 104 and passes through the optional packing material 112 and then passes through the solid precursor compound where vapors of the solid precursor compound are entrained in the carrier gas. The restrictor 118 and the labyrinth prevent the solid particles of the precursor compound from leaving the delivery device 100, while at the same time allowing the vapors of the solid precursor compound to leave the delivery device to travel to the reactor.

An exemplary reactor is a chemical vapor deposition system. A chemical vapor deposition system includes a deposition chamber, which is a heated vessel within which is disposed at least one, and possibly many, substrates. The deposition chamber has an outlet, which is typically connected to a vacuum pump in order to draw by-products out of the chamber and to provide a reduced pressure where that is appropriate. Metal-organic chemical vapor deposition ("MOCVD") can be conducted at atmospheric or reduced pressure. The deposition chamber is maintained at a temperature sufficiently high to induce decomposition of the vaporized solid precursor compound. The deposition chamber has a temperature of 300 to 1000° C., the exact temperature being selected to optimize the deposition. Optionally, the temperature in the deposition chamber as a whole can be reduced if the substrate is maintained at an elevated temperature, or if other energy such as radio frequency ("RF") energy is generated by an RF source.

Exemplary substrates for deposition, in the case of electronic device manufacture, may be sapphire ($Al_2O_3$), silicon, gallium arsenide, and indium phosphide. Substrates including other materials may also be suitably used. Such substrates are particularly useful in the manufacture of LEDs, diode lasers, and integrated circuits.

Deposition is continued for as long as desired to produce a metal film having the desired properties. In one embodiment, the film thickness will be from several hundred to several thousand angstroms or more when deposition is stopped.

Also provided by the present invention is a method of depositing a film comprising providing the delivery device described above, wherein the delivery device has an inlet port and an outlet port with a labyrinth disposed therebetween; introducing a carrier gas into the delivery device through the inlet port; flowing the carrier gas through the packing material and the solid precursor compound to substantially saturate the carrier gas with the precursor compound; the precursor compound saturated carrier gas exiting from the delivery device through the outlet port, wherein the labyrinth causes the carrier gas to make at least two turns, each turn being greater than or equal to an average angle of about 120 degrees when measured with respect to the average direction of the carrier gas (and any entrained solid vapors) prior to making the turn; delivering the precursor compound saturated carrier gas to a reaction vessel containing a substrate; and subjecting the precursor compound saturated carrier gas to conditions sufficient to decompose the precursor compound to form a film on the substrate.

In yet another embodiment, the present invention provides a method of depositing a film on a substrate comprising introducing a carrier gas into a delivery device having an elongated cylindrical shaped portion; an inlet chamber and an outlet chamber in fluid communication with each other and partially separated by a conical section; the inlet chamber being in fluid communication with an inlet port through which the carrier gas is introduced; the outlet chamber being in fluid communication with an outlet port via a labyrinth, where the labyrinth comprises a restrictor disposed on a floor of the outlet chamber; the restrictor surrounding a lower portion of the conical section such that conical section protrudes through a plane that contacts all points of an upper surface of the restrictor; flowing the carrier gas through a layer of packing material and a solid precursor compound contained in the inlet chamber and the outlet chamber and contacting the solid precursor compound to substantially saturate the carrier gas with the precursor compound; the saturated carrier gas exiting from the delivery device through the outlet port via the labyrinth; delivering the precursor compound saturated carrier gas to a reaction vessel containing a substrate; and subjecting the precursor compound saturated carrier gas to conditions sufficient to decompose the precursor compound to form a film on the substrate.

The design disclosed herein is advantageous in that it can supply a constant ratio of entrained vapors of the solid precursor compound to the carrier gas over extended periods of time. The labyrinth does not get plugged as do porous sections that are also meant to prevent solid particles from escaping into the outlet port. The presence of the labyrinth thus permits a uniform delivery of the vapors of the solid precursor compound at relatively high concentrations over extended periods of time while preventing any solid particles from being transferred from the delivery device to the reactor.

What is claimed is:

1. A delivery device comprising:
    an inlet port;
    an outlet port;
    an inlet chamber; and
    an outlet chamber; the outlet chamber being opposedly disposed to the inlet chamber and in fluid communication with the inlet chamber via a conical section; the outlet chamber comprising a labyrinth that is operative to prevent particles of a solid precursor compound contained in the delivery device from leaving the delivery device while at the same time permitting vapors of the solid precursor compound to leave the delivery device via the outlet port; where the labyrinth is formed by a restrictor, the conical section and an inner wall of the delivery device; where a portion of the conical section protrudes through a plane that includes a surface of the restrictor.

2. The delivery device of claim 1, where a height of the restrictor is greater than a height of the conical section taken at is smallest diameter when measured from a floor or from a roof of the outlet chamber.

3. The delivery device of claim 2, where the outlet chamber comprises a plurality of restrictors, where at least one restrictor is disposed on a surface of the conical section.

4. The delivery device of claim 3, where the restrictor further comprises a baffle that protrudes into a path of a carrier gas travelling from the inlet port to the outlet port.

5. The delivery device of claim 1, wherein the labyrinth causes a carrier gas travelling from the inlet port to the outlet port to make two or more turns; each turn being through an average angle of greater than or equal to about 120 degrees; the turns being measured with respect to an average direction of travel prior to making the turn.

6. The delivery device of claim 1, where the restrictor is a ring that surrounds the conical section.

7. A method of depositing a film comprises:
    providing a delivery device; wherein the delivery device has an inlet port and an outlet port with a labyrinth disposed therebetween; the labyrinth being formed by a restrictor, a conical section and an inner wall of the delivery device; where a portion of the conical section protrudes through a plane that includes a surface of the restrictor;
    introducing a carrier gas into the delivery device through the inlet port;
    flowing the carrier gas through a solid precursor compound to substantially saturate the carrier gas with the precursor compound; the carrier gas saturated with the precursor compound exiting from the delivery device through the outlet port, where the labyrinth causes the carrier gas to make at least two turns, each turn being greater than or equal to an average angle of about 120 degrees when measured with respect to the average direction of the carrier gas prior to making the turn;
    delivering the carrier gas with the precursor compound to a reaction vessel containing a substrate; and
    subjecting the precursor compound to conditions sufficient to decompose the precursor compound to form a film on the substrate.

8. The method of claim 7, wherein the carrier gas flows from top to bottom through the delivery device.

9. The method of claim 7, wherein the carrier gas flows from bottom to top through the delivery device.

* * * * *